US005593767A

United States Patent [19]

Noda et al.

[11] Patent Number: 5,593,767
[45] Date of Patent: Jan. 14, 1997

[54] LAMINATE, A GLASS FIBER WOVEN FABRIC AND A PRINTED WIRING BOARD

[75] Inventors: Masayuki Noda; Minoru Yonekura, both of Hikone; Hiroyuki Yamanaka, Shiga-ken, all of Japan

[73] Assignee: Shin-Kobe Electric Machinery Co., Ltd., Tokyo, Japan

[21] Appl. No.: 633,512

[22] Filed: Apr. 17, 1996

[30] Foreign Application Priority Data

Apr. 26, 1995 [JP] Japan .................................. 7-101784

[51] Int. Cl.$^6$ ...................................................... B32B 7/00
[52] U.S. Cl. .......................... 428/251; 428/257; 428/258; 428/259; 428/268; 428/273; 428/290; 428/901
[58] Field of Search ...................................... 428/251, 257, 428/258, 259, 268, 273, 290, 901

[56] References Cited

U.S. PATENT DOCUMENTS

| | | | |
|---|---|---|---|
| 4,563,385 | 1/1986 | Bhatt et al. | 428/251 |
| 5,085,922 | 2/1992 | Murasawa | 428/901 |
| 5,206,078 | 4/1993 | Inoguchi et al. | 428/901 |

Primary Examiner—James J. Bell
Attorney, Agent, or Firm—Pearne, Gordon, McCoy & Granger

[57] ABSTRACT

A laminate comprising glass fiber woven fabrics impregnated with thermo-setting resin and superposed one on another while heated and pressed and said glass fiber woven fabrics having warps and wefts which are of components different from each other and of coefficients of thermal expansion different from each other.

5 Claims, No Drawings

LAMINATE, A GLASS FIBER WOVEN FABRIC AND A PRINTED WIRING BOARD

BACKGROUND OF THE INVENTION

This invention pertains to an improvement on a laminate suitably used for an insulation base material of a printed wiring board, a glass fiber woven fabric used for a laminate base material and a printed wiring board having a laminate as an insulation base material.

Of late, there has been remarkably required an electronic device having compactness and multi-function, which has been accomplished by providing a printed wiring board for the electronic device with higher packaging density. Furthermore, the parts packaged in the printed wiring board have been lighted, thinned and shortened, which causes them to have a lower coefficient of thermal expansion.

In a prior art, an insulation base material for a printed wiring board comprises a laminate produced by preparing glass fiber woven fabrics as base material formed of warps and wefts, both of which are of E glass yarn and impregnated with thermo-setting resin and dried to form prepregs and then superposing them one upon another while they are heated and pressed. Such a laminate has a coefficient of thermal expansion of about 16 ppm/°C. With parts of low coefficient of thermal expansion packaged in such as insulation base material for the printed wiring board, thermal stress will be applied to the soldered joints of the printed wiring board due to a difference of coefficient of thermal expansion between the packaged parts and the insulation base material. As a result, the soldered joints tend to have cracks provided therein. More particularly, if ceramic packages or thin small outline packages (TSOP) having a coefficient of thermal expansion of 8 ppm/°C. or less than will be mounted on the aforementioned insulation base material, cracks in the soldered joints will be hardly avoided.

If glass fiber woven fabrics formed of warps and wefts of T glass yarn are used as base material which is to be impregnated with thermosetting resin, then there will be produced a laminate having a coefficient of thermal expansion of 8 ppm/°C. or less than. However, such a laminate disadvantagesouly has a poor drill workability.

SUMMARY OF THE INVENTION

Accordingly, it is a principal object of the invention to provide a laminate suitably used for an insulation base material of a printed wiring board having a good drill workability and adapted to effectively package parts of low coefficient of thermal expansion.

It is another object of the invention to provide a glass fiber fabric suitably used for the aforementioned laminate.

It is further object of the invention to provide a printed wiring board having the aforementioned laminate as an insluation base material of a printed wiring board.

In accorance with one aspect of the invention, there is provided a laminate comprising glass fiber woven fabrics impregnated with thermo-setting resin and superposed one on another while heated and pressed and said glass fiber woven fabrics having warps and wefts which are of components different from each other while one of said warps and said wefts having a coefficient of thermal expansion lower than that of the other.

For example, the warps of the glass fiber woven fabrics may be formed of glass fiber yarn of component having a coefficient of thermal expansion of 4 ppm/°C. or less than while the wefts thereof may be formed of E glass fiber yarn. Alternatively, the wefts of the glass fiber woven fabrics may be formed of glass fiber yarn of component having a coefficient of thermal expansion of 4 ppm/°C. or less than while the warps thereof may be formed of E glass fiber yarn.

In accordance with another aspect of the invention, there is provided a glass fiber woven fabric for a laminate base material which is to be impregnated with thermo-setting resin and heated and pressed and said glass fiber woven fabric characterized by having warps and wefts which are of components different from each other while one of said warps and said wefts having a coefficient of thermal expansion lower than that of the other.

In accordance with further aspect of the invention, there is provided a printed wiring board having a laminate as an insulation base material of a printed wiring board characterized by said laminate comprising glass fiber woven fabrics formed of warps and wefts which are of components different from each other while one of said warps and said wefts having a coefficient of thermal expansion lower than that of the other and said laminate being so arranged that said one of said warps and said wefts having a lower coefficient of thermal expansion is placed along a longitudinal direction of parts packaged in said printed wiring board.

With the warps and the wefts of the glass fiber woven fabrics for the laminate having components different from each other, a drill workability of the laminate will be more improved.

The glass fiber yarn of lower coefficient of thermal expansion is hard because it includes $SiO_2$ and/or $B_2O_3$ as components thereof. Therfore, the laminate comprising glass fiber woven fabrics formed of warps and wefts, both of which are of such lower coefficient of thermal expansion has a poor drill workability, which will cause a drill edge to be remarkably worn away.

With one of the warps and the wefts of the glass fiber woven fabrics having a coefficient of thermal expansion lower than the other, that is harder than the other, a drill edge will be hardly worn away because chip of the softer glass fiber yarn scrapes off the harder glass fiber yarn at the leading portion of the drill edge when the laminate is worked by the drill.

In general, the resin has a coefficient of thermal expansion of about 60 ppm/°C. and a coefficient of thermal expansion of the laminate tends to be higher as the content of the resin increases. The laminate has the coefficient of thermal expansion prevented from increasing in a direction along the yarn having a lower coefficient of thermal expansion.

When the laminate of the invention is to be used for the insulation base material of the printed wiring board, it should be so arranged that one of the warp or the weft of the glass fiber woven fabrics having a coefficient of thermal expansion is placed along the longitudinal direction of the packaged parts. That is why the laminate is affected by the thermal expansion or shrinkage as the portions of the packaged parts secured by soldering are longer.

With one of the warp and the weft of the glass fiber woven fabrics formed of glass fiber yarn having the coefficient of thermal expansion of 4 ppm/°C. or less than, there will be advantageously no variation in the coefficient of thermal expansion of the laminate along the longitudinal direction of the glass fiber yarn having the lower coefficient of thermal expansion even though the content of the resin increases. In this case, the other glass fiber yarn may be preferably of E glass fiber yarn because this causes the drill workability to be more improved.

Although the warps and the wefts of the glass fiber woven fabrics will be considered to be formed of a combination of glass fibers of lower coefficient of thermal expansion and E glass fibers, the laminate formed of such glass fiber woven fabrics has a poor drill workability. In addition thereto, such a laminate will have the coefficient of thermal expansion higher as the content of the resin increases.

DETAILED DESCRIPTION OF EXAMPLES OF THE INVENTION

Now, some examples of the invention together with prior arts and comparisons will be described hereinjustbelow.

A thermo-setting resin used for the invention may be polyimide, phenol resin, cyanate resin, cyanate ester resin, epoxy resin, unsaturated ester and so on, but limitted thereto. Flame resistance auxiliaries such as organic compound including halogen, antimony oxide and the like may be added to the resin in order to provide the resin with flame resistance and a bit of filler, coloring agent or the like may be added thereto.

Metal foil or foils may be adhered integrally to the laminate when the prepregs are superposed one on another. The metal foil may be of electrically conductive metal such as copper, aluminium, nickel or the like and may have proper thickness not limited. A metal foil having adhesives may be used, if necessary. The adhesives may be of general purpose material such as phenol resin, epoxy resin, butyral resin, polyester, polyurethane or a mixture thereof.

E glass may have conventional components of 52 through 56 weight % of $SiO_2$, 12 through 16 weight % of $Al_2O_3$, 15 through 25 weight % of CaO, 0 through 6 weight % of MgO and 8 though 13 weight of $B_2O_3$, which has a coefficient of thermal expansion of about 4.8 through 6.0 ppm/°C.

EXAMPLES I THROUGH VI

Various varnishes were prepared by blending 100 weight parts of epoxy resin commercially available under the tradename of Ep-1001 from the Yuka Shell Co., Ltd., Japan and having an epoxy equivalent of 480, 3 weight parts of dicyandiamide and 0.2 weight parts of 2-ethyl 4- methyl-imidazole as a catalyst.

Various glass fiber yarns were prepared for warps and wefts as shown in Table I and various glass fiber woven fabrics of 100 μm thickness having a warp density of 60 yarns/25 mm and a weft density of 58 yarns/25 mm were prepared by weaving the warps and the wefts selected from the glass fiber yarns of Table I as shown in Table II. Prepregs having the content of the resin as shown in Table II were produced by impregnating the glass fiber woven fabrics with the varnish prepared in the aforementioned manner and dried.

Five prepregs were superposed one on another and copper foils of 18 μm thickness were mounted on the both faces of the superposed prepregs, heated at a temperature of 170° C. and pressed under a pressure of 40 kgf/cm² for 60 minutes to produce copper foil placed laminates of 0.6 mm thickness. The characteristics of the thus produced copper foil placed laminates are shown in Table II.

TABLE I

| Coefficient of thermal expansion (ppm/°C.) | 1.0 | 3.3 | 4.5 | 5.3* |
|---|---|---|---|---|
| (Composition of glass fiber yarn) | | | | |
| $SiO_2$ | 96 | 60 | 67 | 55 |
| $Na_2O$ | — | — | 5 | — |
| $K_2O$ | — | — | 1 | — |
| CaO | — | — | — | 20 |
| MgO | — | 15 | — | — |
| BaO | 3 | — | — | — |
| $B_2O_3$ | — | — | 24 | 10 |
| $Al_2O_3$ | 1 | 25 | 3 | 15 |

The glass fiber yarn having a coefficient of thermal expansion of 5.3 ppm/°C. indicated by * is E glass yarn.

TABLE II

| | I | II | III | IV | V | VI |
|---|---|---|---|---|---|---|
| Coefficient of thermal expansion (ppm/°C.) of glass fiber woven fabric | | | | | | |
| Warp | 4.5 | 3.3 | 1.0 | 5.3* | | 3.3 |
| Weft | | 5.3* | | 3.3 | | 5.3* |
| Content of resin in prepregs (%) | | | | | | |
| | | | 40 | | 48 | 33 |
| Characteristics of laminates | | | | | | |
| Rate of wear of drill (%) | | | | | | |
| | 30 | 35 | 40 | 30 | 25 | 35 |
| Coefficient of thermal expanison (ppm/°C.) | | | | | | |
| Longitudinal direction | 10 | 9 | 5 | 11 | 9 | 9 |
| Lateral direction | 12 | 11 | 10 | 9 | 12 | 10 |

What is indicated by * is E glass fiber yarn.

PRIOR ARTS I AND II

Various glass fiber yarns were prepared for warps and wefts as shown in Table I and various glass fiber woven fabrics of 100 μm thickness having a warp density of 60 yarns/25 mm and a weft density of 58 yarns/25 mm were prepared by weaving the warps and the wefts selected from the glass fiber yarns of Table I as shown in Table III. Prepregs having the content of the resin as shown in Table III were produced by impregnating the glass fiber woven fabrics with the varnish of Example I and dried.

Five prepregs were superposed one on another and copper foils of 18 μm thickness were mounted on the both faces of the superposed prepregs, treated in the same condition as Example I to produce copper foil placed laminates of 0.6 mm thickness. The characteristics of the thus produced copper foil placed laminates are shown in Table III.

COMPARISONS I AND II

Yarns were produced by twsiting 100 filaments of E glass fiber and 100 filaments of glass fiber having a coefficient of thermal expansion of 3.3 ppm/°C. The apparent coefficient of thermal expansion of the thus produced yarns was 4.3 ppm/°C. The glass fiber woven fabrics of 100μm thickness having a warp density of 60 yarns/25 mm and a weft density of 58 yarns/25 mm were prepared by weaving the warps and the wefts formed of the yarns produced in the aforementioned manner. Prepregs having the content of the resin as shown in Table III were produced by impregnating the glass fiber woven fabrics with the varnish of Example I and dried.

Five prepregs were superposed one on another and copper foils of 18 μm thickness were mounted on the both faces of the superposed prepregs, treated in the same condition as Example I to produce copper foil placed laminates of 0.6 mm thickness. The characteristics of the thus produced copper foil placed laminates are shown in Table III.

TABLE III

|  | PRIOR ARTS | | COMPARISONS | |
| --- | --- | --- | --- | --- |
|  | I | II | I | II |
| Coefficient of thermal expansion (ppm/°C.) of glass fiber woven fabric | | | | |
| Warp | 3.3 | 5.3* | 4.3 | |
| Weft | 3.3 | 5.3* | 4.3 | |
| Content of resin in prepregs (%) | | | | |
|  | | 40 | | 48 |
| Characteristics of laminates | | | | |
| Rate of wear of drill (%) | | | | |
|  | 50 | 30 | 43 | 41 |
| Coefficient of thermal expansion (ppm/°C.) | | | | |
| Longitudinal direction | 9 | 13 | 10 | 12 |
| Lateral direction | 10 | 15 | 11 | 14 |

What is indicated by * is E glass fiber yarn.

In Tables II and III, the rate of wear of drill was measured after drilling two copper placed laminates superposed one on the other at 2,000 times by a drill of 0.4 mm diameter manufactured by and commercially available from Union Tool Company, Japan under the trademark of UC-35.

As noted from Table I, the laminates of the invention have the lower coefficient of thermal expansion in the direction corresponding to that of the yarns of the glass fiber woven fabric having the lower coefficient of thermal expansion and the lower rate of wear of drill when drilling them. It is confirmed that they have the coefficient of thermal expansion not so higher also in the direction correspnding to that of the yarns of the higher coefficient of thermal expansion.

With one of the warp and the weft of the glass fiber fabric formed of yarn having the glass component of 4 ppm/°C. or less than while the other yarns is formed of E glass fiber yarn, the laminates have the coefficient of thermal expansion not so much higher and the good drill workability even though the content of the resin increases so long as the same yarns are used.

While some preferred examples of the invention have been described, it will be understood by those skilled in the art that they are by way of examples and that they might be modified without departing from the spirit and scope of the invention, which is defined only to the appended claims.

What is claimed is:

1. A laminate comprising glass fiber woven fabrics impregnated with thermo-setting resin and superposed one on another while heated and pressed and said glass fiber woven fabrics having warps and wefts which are of components different from each other while one of said warp and said weft having a coefficient of thermal expansion lower than that of the other.

2. A laminate as set forth in claim 1, and wherein said warps of said glass fiber woven fabrics are formed of glass fiber yarn of component having a coefficient of thermal expansion of 4 ppm/°C. or less than while said wefts thereof are formed of E glass fiber yarn.

3. A laminate as set forth in claim 1, and wherein said wefts of said glass fiber woven fabrics are formed of glass fiber yarn of component having a coefficient of thermal expansion of 4 ppm/°C. or less than while said warps thereof are formed of E glass fiber yarn.

4. A glass fiber woven fabric for a laminate base material which is to be impregnated with thermo-setting resin and superposed one on another while heated and pressed, and said glass fiber woven fabric characterized by having warps and wefts which are of components different from each other while one of said warp and said weft having a coefficient of thermal expansion lower than that of the other.

5. A printed wiring board having a laminate as an insulation base material characterized by said laminate comprising glass fiber woven fabrics formed of warps and wefts which are of components different from each other while one of said warp and said weft having a coefficient of thermal expansion lower than that of the other and said laminate being so arranged that said one of said warp and said weft having a lower coefficient of thermal expansion is placed along a longitudinal direction of parts packaged in said printed wiring board.

* * * * *